(12) United States Patent
Cuggino

(10) Patent No.: US 9,124,222 B2
(45) Date of Patent: Sep. 1, 2015

(54) INTERNALLY, RESISTIVELY, SENSED DARLINGTON AMPLIFIER

(71) Applicant: Hittite Microwave Corporation, Chelmsford, MA (US)

(72) Inventor: Joseph Cuggino, Westford, MA (US)

(73) Assignee: HITTITE MICROWAVE CORPORATION, Chelmsford, MA (US)

( * ) Notice: Subject to any disclaimer, the term of this patent is extended or adjusted under 35 U.S.C. 154(b) by 85 days.

(21) Appl. No.: 13/827,139

(22) Filed: Mar. 14, 2013

(65) Prior Publication Data

US 2014/0266466 A1    Sep. 18, 2014

(51) Int. Cl.
*H03F 3/19* (2006.01)
*H03F 3/195* (2006.01)
*H03F 1/30* (2006.01)

(52) U.S. Cl.
CPC ............... *H03F 3/195* (2013.01); *H03F 1/302* (2013.01); *H03F 3/19* (2013.01); *H03F 2200/555* (2013.01); *H03F 2200/93* (2013.01)

(58) Field of Classification Search
USPC .......................... 330/285, 296, 307, 310, 150
See application file for complete search history.

(56) References Cited

U.S. PATENT DOCUMENTS

| | | | |
|---|---|---|---|
| 4,706,038 A * | 11/1987 | Navidi et al. | ................. 330/271 |
| 5,859,568 A | 1/1999 | Le et al. | |
| 6,927,634 B1 | 8/2005 | Kobayashi | |
| 7,772,927 B1 | 8/2010 | Shealy et al. | |
| 7,855,603 B1 | 12/2010 | Thor | |
| 2006/0097790 A1 | 5/2006 | Bokatius | |
| 2011/0291764 A1 | 12/2011 | Kobayashi | |

OTHER PUBLICATIONS

Written Opinion from the International Searching Authority for International Application No. PCT/US2014/024593 mailed Jul. 8, 2014, (six (6) pages).

* cited by examiner

*Primary Examiner* — Hieu Nguyen
(74) *Attorney, Agent, or Firm* — Knobbe Martens Olson & Bear LLP

(57) ABSTRACT

An internally, resistively, sensed Darlington amplifier includes a Darlington amplifier, at least an input transistor, an output transistor, a resistive divider, a signal input node, and a signal output node. The Darlington amplifier is responsive to an input signal and configured to generate an output signal. An internal bias setting resistor is coupled between the signal output node, a collector of the output transistor, and the resistive divider. The bias setting resistor is configured to set and regulate the bias current of the Darlington amplifier.

21 Claims, 6 Drawing Sheets

US 9,124,222 B2

INTERNALLY, RESISTIVELY, SENSED DARLINGTON AMPLIFIER

FIELD OF THE INVENTION

This invention relates to an internally, resistively, sensed Darlington amplifier.

BACKGROUND OF THE INVENTION

A Darlington amplifier typically includes an input transistor and an output transistor connected in such a way that the current amplified by the input transistor is amplified further by the output transistor. Such a design has a much higher common/emitter current gain than each transistor taken separately. In the case of integrated devices, a Darlington amplifier can take less space than two individual transistors because it employs a shared collector. Integrated Darlington amplifiers may come packaged singly as three terminal style transistor packages, or as an array of devices on an integrated circuit chip.

Without adequate bias control mechanism, the bias current through a Darlington amplifier will be sensitive to process, temperature, and supply voltage variations. This can be problematic because the bias current determines the gain, output power and distortion characteristics of the Darlington amplifier.

One conventional method to set the bias current Darlington amplifier is to use an off-chip bias resistor as part of a negative feedback network. The bias resistor senses bias current and induces a voltage drop across it that is proportional to the current. The voltage drop reduces the voltage across the Darlington amplifier thus regulating the bias current. The larger the voltage drop across the bias resistor, the higher the negative feedback loop gain and more stable the bias current is and less sensitive the Darlington amplifier will be to supply voltage, process, and temperature variations. However, a larger voltage drop across the bias resistor means there may be less voltage applied to the collectors of the input and output transistors. This reduces the voltage available for the output signal voltage swing. The reduced voltage swing headroom for the output signals may affect saturation output power, compression, third order intercept point (IP3) and other distortion characteristics. Alternatively, voltage swing headroom may be restored by using a higher supply voltage, but this may not be practical and/or it may result in undesirably high DC power dissipation.

Another conventional technique used to bias a Darlington amplifier is disclosed in U.S. Pat. No. 6,927,634, incorporated by reference herein. As disclosed therein, an additional active device, e.g., a transistor, $Q_{BIAS}$, in the form of a current mirror is used to sense the current in the output transistor of the Darlington amplifier. As the current in the output device increases, the voltage at its base increases which is transferred to the base of the active transistor $Q_{BIAS}$. The increase in the base voltage of $Q_{BIAS}$ produces a proportional increase in current. This increase in current increases the voltage drop across the feedback resistor which reduces the voltage at the base of the input transistor. This reduces the current in the input and output transistors of the Darlington amplifier to effectively control the bias current.

Because the active device as disclosed in the '634 patent is placed in the signal path of the amplifier, it needs to be isolated with inductors and capacitors so that it does not interact with the input and output transistors. The effectiveness of such isolation components is dependent on frequency. The result may be degradation of the noise figure of the Darlington amplifier

SUMMARY OF THE INVENTION

In one aspect, an internally, resistively, sensed Darlington amplifier is featured. The Darlington amplifier includes at least an input transistor, an output transistor, a resistive divider, a signal input node, and a signal output node. The Darlington amplifier is responsive to an input signal and configured to generate an output signal. An internal bias setting resistor is coupled between the signal output node, a collector of the output transistor, and the resistive divider. The bias setting resistor is configured to set and regulate the bias current of the Darlington amplifier.

In one embodiment, the internally, resistively, sensed Darlington amplifier may be implemented on an integrated circuit chip and/or within a common package. The internal bias setting resistor may be included on the integrated circuit chip and/or housed in the same common package. The resistive divider may include a feedback resistor and a divider resistor. The internally, resistively, sensed Darlington amplifier may include one or more diodes coupled in series between the divider resistor and a ground configured to adjust DC voltage at the signal input node to compensate for temperature and process variations in the input transistor and the output transistor. The internally, resistively, sensed Darlington amplifier may include at least one inductor coupled in series between the feedback resistor and the divider resistor configured to provide isolation of the divider resistor and/or the one or more diodes from the signal input node. The internally, resistively, sensed Darlington amplifier may include at least one capacitor coupled between the at least one inductor and a ground terminal to provide RF bypassing around the divider resistor. The internally, resistively, sensed Darlington amplifier may include a capacitor connected in parallel with the internal bias setting resistor configured to short the internal bias setting resistor at high frequencies.

In another aspect, an internally, resistively, sensed Darlington amplifier is featured. The Darlington amplifier includes at least an input transistor, an output transistor, a resistive divider comprising a feedback resistor and a divider resistor, a signal input node, and a signal output node. The Darlington amplifier is responsive to an input signal and configured to generate an output signal. An internal bias setting resistor is coupled between the signal output and a collector of the output transistor and the resistive divider. The bias setting resistor is configured to set and regulate the bias current of the Darlington amplifier. One or more diodes coupled in series between the divider resistor and a ground are configured to adjust DC voltage at the signal input node to compensate for temperate and process variations in the input transistor and the output transistor.

In one embodiment, the internally, resistively, sensed Darlington amplifier may be implemented on an integrated circuit chip or a transistor and/or within a common package. The internal bias setting resistor may be included on the integrated circuit chip and/or housed in the same common package. The internally, resistively, sensed Darlington amplifier may include at least one capacitor coupled in parallel with the diode and divider resistor configured to provide isolation of the divider resistor and/or the one or more diodes from the signal input node. The internally, resistively, sensed Darlington amplifier may include at least one inductor coupled in series between the feedback resistor and the divider resistor configured to provide isolation of the divider resistor and/or the one or more diodes from the signal input node. The internally, resistively, sensed Darlington amplifier may include at least one capacitor coupled between the at least one inductor and a ground terminal to provide signal bypassing around the divider resistor. The internally, resistively, sensed Darlington amplifier may include a capacitor connected in parallel with the internal bias setting resistor configured to short the internal bias setting resistor at high frequencies.

In another aspect, an internally, resistively, sensed Darlington amplifier is featured. The Darlington amplifier includes at least an input transistor, an output transistor, a resistive divider, a signal input node, and a signal output node. The Darlington amplifier is responsive to an input signal and configured to generate an output signal. An internal bias setting resistor is coupled between the signal output node, a collector of the output transistor, and the resistive divider, the bias setting resistor are configured to set and regulate the bias current of the Darlington amplifier. A capacitor connected in parallel with the internal bias setting resistor is configured to short the internal bias setting resistor setting at high frequencies.

In one embodiment, the internally, resistively, sensed Darlington amplifier may be implemented on an integrated circuit chip or a transistor package. The internal bias setting transistor may be implemented on the integrated circuit chip or the transistor package. The resistive divider may include a feedback resistor and a divider resistor. The internally, resistively, sensed Darlington amplifier may include one or more diodes coupled in series between the divider resistor and a ground configured to adjust DC voltage at the signal input node to compensate for temperature and process variations in the input transistor and the output transistor. The internally, resistively, sensed Darlington amplifier may include at least one capacitor coupled between the at least one inductor and a ground terminal to provide RF bypassing around the divider resistor.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
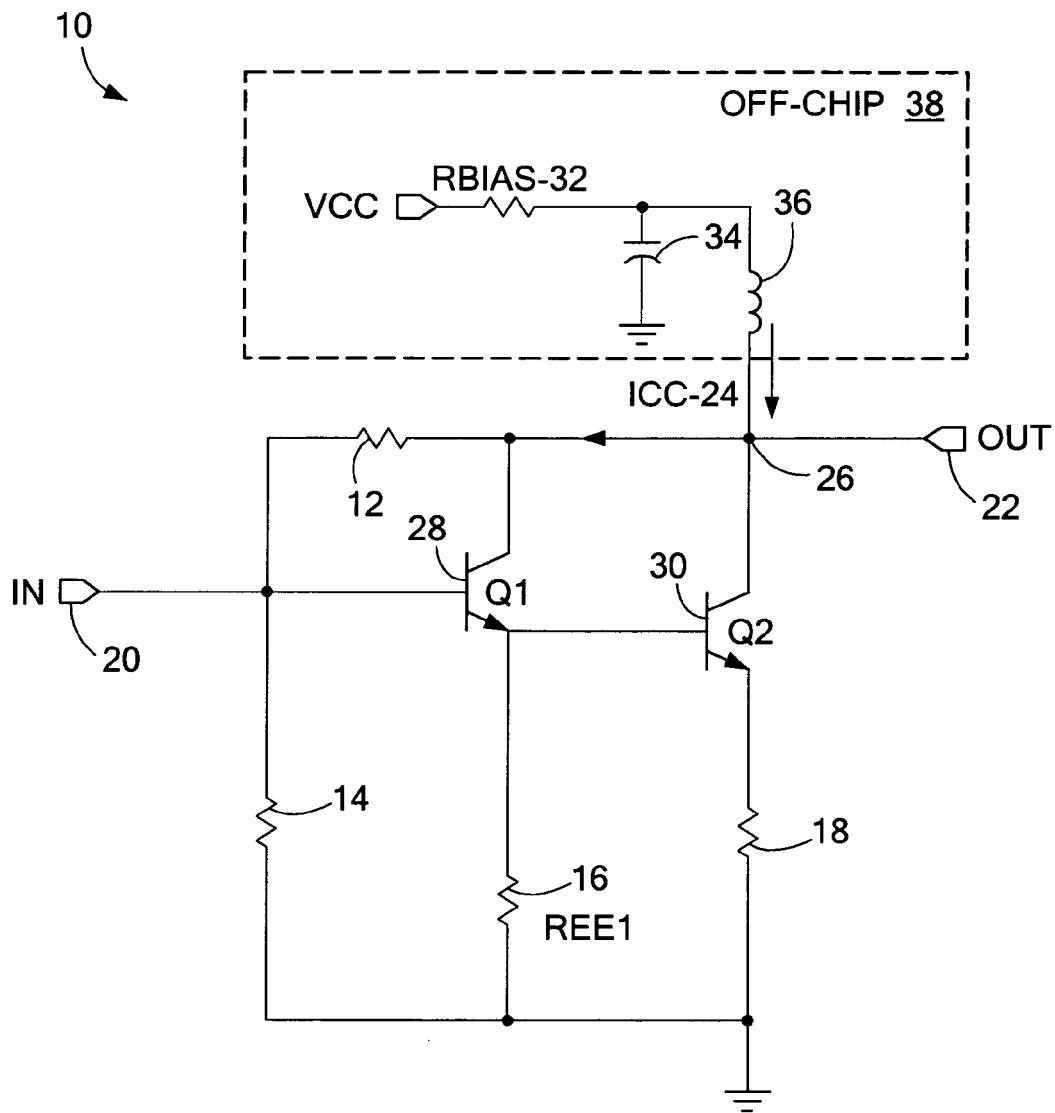
FIG. 1 is a schematic circuit diagram of a conventional Darlington amplifier and an external biasing resistor used to set the bias current.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Conventional Darlington amplifier 10, FIG. 1, includes input transistor Q1, output transistor Q2, a resistive divider which includes feedback resistor 12 and divider resistor 14. Darlington amplifier 10 also includes bias resistor 16 and gain-setting resistor 18 associated with input and output transistors Q1, Q2, respectively. Darlington amplifier 10 is typically a three terminal device that includes input node 20 and output node 22. In operation, Darlington amplifier 10 is responsive to an input signal at input node 20 and generates an amplified output signal at output node 22. The DC supply current to the Darlington amplifier is typically fed to its output node 22 through an inductor 36. As discussed in the Background section above, Darlington amplifier 10 will self bias to an operating point based on the DC voltage at the output node 22. This operating point will be very sensitive to process, temperature, and supply voltage variations unless some form of negative feedback is used to regulate the current through it.

One conventional technique used to provide negative feedback to regulate the bias current is to include externally located bias resistor $R_{BIAS}$-32 in conjunction with decoupling capacitor 34, which are located off-chip as indicated by caption 38. The DC bias current ICC-24 at node 26 is regulated through bias resistor $R_{BIAS}$-32 while capacitor 34 and inductor 36 provide radio frequency (RF) decoupling. Bias current ICC-24 at node 32 induces a voltage drop across resistor $R_{BIAS}$-32 which reduces the voltage across Darlington amplifier 10 to regulate the bias current-24. As discussed in the Background section above, the large voltage drop across bias resistor $R_{BIAS}$-32 means there will be less voltage applied to collectors 28, 30 of the input and output transistors Q1 and Q2. This will reduce the head room which may affect saturation output power, compression, and third order intercept point (IP3).

Figure 2:
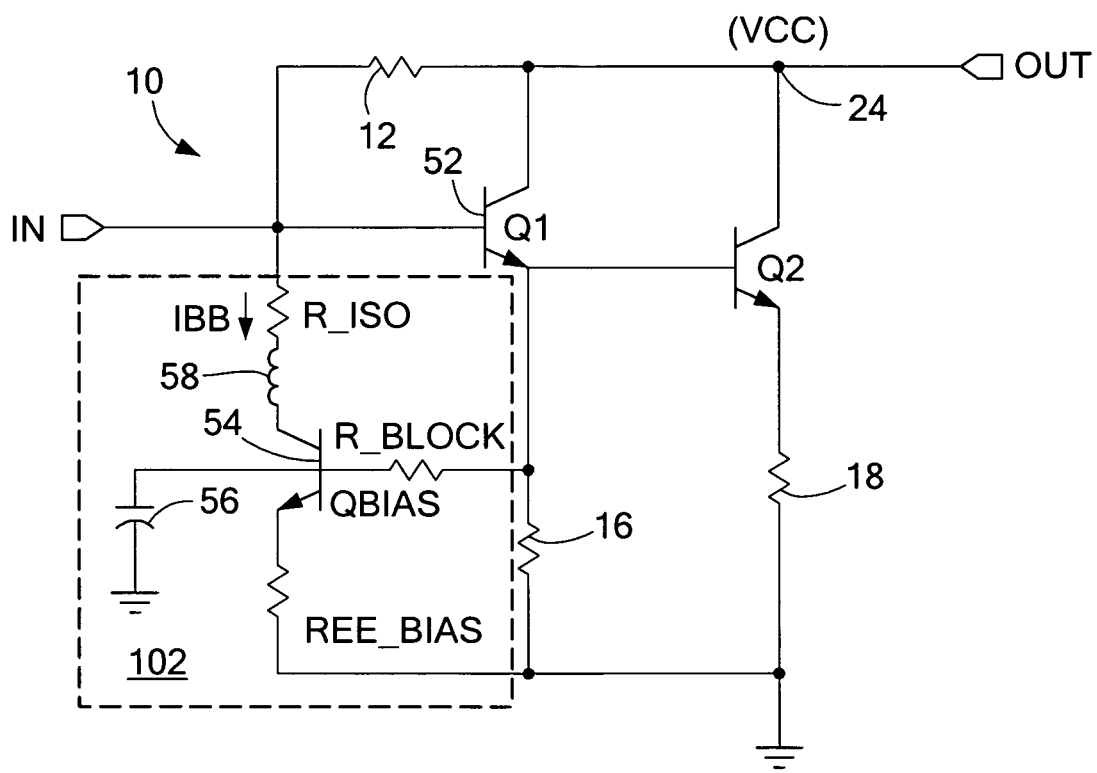
FIG. 2 is a schematic circuit diagram of a conventional self-biased Darlington amplifier.

An active bias Darlington amplifier 50, FIG. 2, where like parts have been given like numbers, includes an additional active device, $Q_{BIAS}$, which senses the current in the output transistor Q1 through the base emitter voltage. As the current in output device Q1 increases, the voltage at base 52 of transistor Q1 also increases. This voltage increase is transferred to base 54 of $Q_{BIAS}$. The increase in voltage at base 54 of $Q_{BIAS}$ produces a proportional increase in current. This increase in current increases the voltage drop across feedback resistor 12, thus reducing the voltage at base 52 of Q1 which reduces the current in Q1 and in turn Q2 to thus effectively regulating the bias current at node 24. This circuit still requires a bias inductor similar to inductor 36, FIG. 1, to couple the DC supply voltage and current to the amplifier, but it does not require bias resistor 32.

As discussed in the Background section above, because $Q_{BIAS}$ is placed in the signal path of the amplifier 10, it needs to be isolated with inductors and capacitors so that it does not interact with the input and output transistors. The effectiveness of such isolation components is dependent on frequency. The result may be degradation of the noise figure of the Darlington amplifier and poor operating characteristics at high frequencies.

Figure 3:
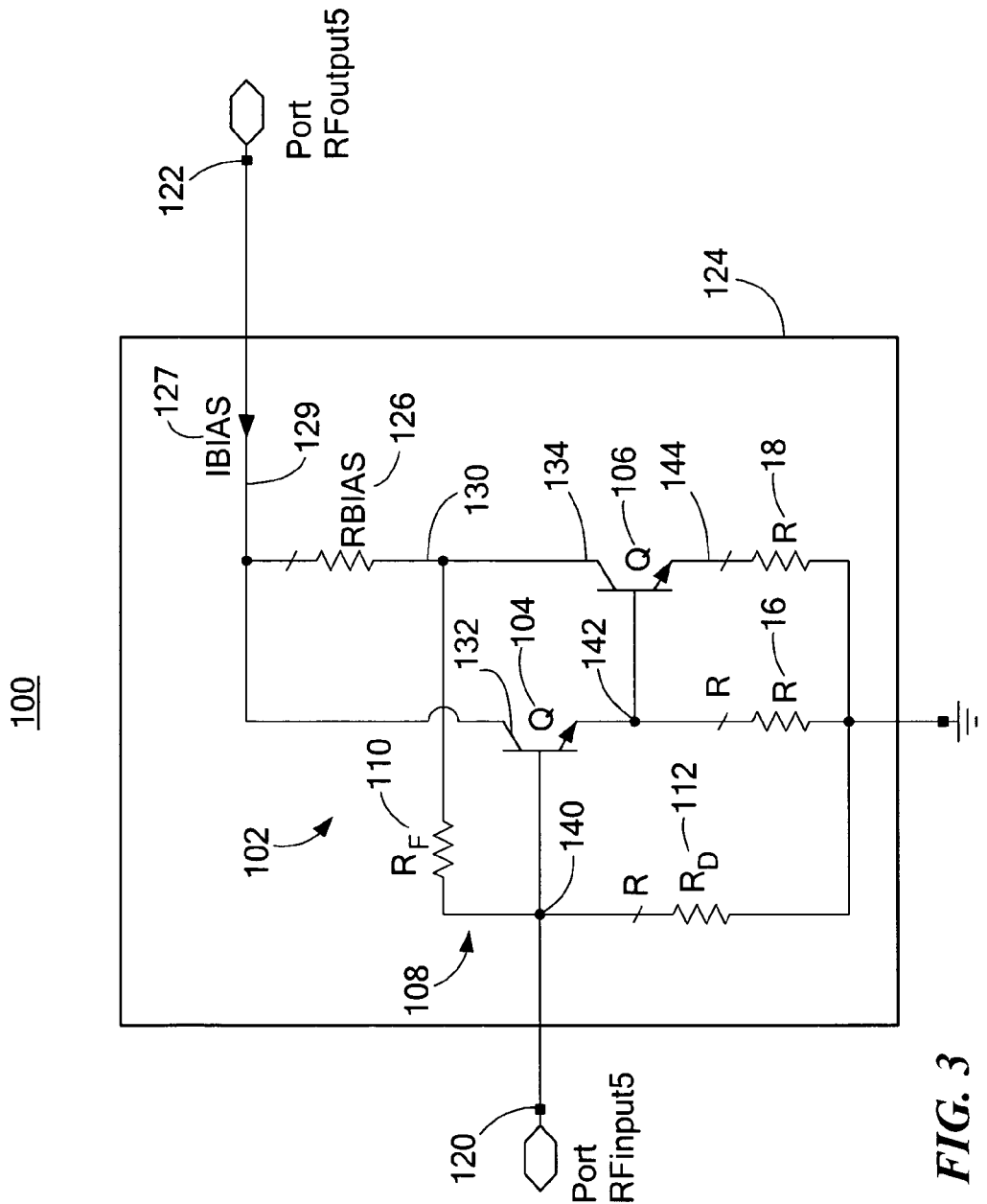
FIG. 3 is a schematic circuit diagram of one embodiment of the internally, resistively, sensed Darlington amplifier of this invention.

There is shown in FIG. 3 one embodiment of internally, resistively, sensed Darlington amplifier 100 of this invention. Internally, resistively, sensed Darlington amplifier 100 includes a conventional Darlington amplifier 102 which is similar to Darlington amplifier 10 discussed above with reference to FIG. 1. In this example, Darlington amplifier 100, FIG. 3, includes input transistor Q-104, output transistor Q-106, resistive divider 108 comprised of feedback resistor $R_F$-110 and divider resistor $R_D$112, bias resistor R-16, and gain-setting resistor R-18. Darlington amplifier 100 also includes signal input node or port 120 and signal output node or port 122. Darlington amplifier 100 is responsive to an input signal at signal input node or port 120 and generates an output signal at output node or port 122. In one design, Darlington amplifier 102 is preferably a fabricated on an integrated circuit chip, indicated at 124.

Internally, resistively, sensed Darlington amplifier 100 also includes internal bias setting resistor $R_{BIAS}$-126 coupled between output node or port 122, collector 134 of output transistor Q-106 and resistive divider network 108. Bias setting resistor $R_{BIAS}$-126 is configured to set and regulate the bias current of Darlington amplifier 102, as discussed below. As shown, $R_{BIAS}$-126 is preferably located on fabricated package or on an integrated circuit chip, indicated at 124. Internally, resistively, sensed Darlington amplifier 100 also needs a bias inductor similar to inductor 36, discussed above with reference to FIG. 1, to couple the DC supply voltage and current to the amplifier. However, as discussed below, internally, resistively, sensed Darlington amplifier 100, FIG. 3, does not require off-chip bias resistor 32, FIG. 1, so that the full external Vcc supply voltage can be applied to the amplifier output node.

In operation, $R_{BIAS}$-126 acts as a current sense resistor to set and regulate the bias current of Darlington amplifier 102. For example, if the DC bias current, $I_{BIAS}$-127 on line 129 going into Darlington amplifier 102 is too high, more current is passes through $R_{BIAS}$-126 which results in a large voltage drop across resistor $R_{BIAS}$-126 which decreases the voltage at node 130. This decreased voltage is then applied through voltage divider 108 which results in a reduced voltage at node 140. The reduced voltage at node 140 reduces the current generated by input transistor Q-104. Similarly, the voltage at node 142 will be reduced by the base-emitter voltage drop across Q-104 and the current generated by output transistor Q-106 is similarly reduced. The reduced current in collectors 132, 134 of Q-104, Q-106, respectively, reduces bias current $I_{BIAS}$-127. The same type operation is performed by internally, resistively, sensed Darlington amplifier 100 when the bias current $I_{BIAS}$-127 is too low. Thus, internally, resistively, sensed Darlington amplifier 100 with internal bias setting resistor $R_{BIAS}$-126 sets and regulates DC bias current $I_{BIAS}$-127 input to Darlington amplifier 102.

One key feature of internally, resistively, sensed Darlington amplifier 100 is that bias setting resistor $R_{BIAS}$-126 is connected only to one of the active devices of Darlington amplifier 102, namely output transistors Q-106. Thus, internally, resistively, sensed Darlington amplifier 100 senses only current in collector 134 of output transistor Q-106 without reducing the voltage across the input transistor Q-104 and the need for off-chip bias resistor 32, FIG. 1, is eliminated. The result is internally, resistively, sensed Darlington amplifier 100 does not reduce voltage head room of the input transistor Q-104 and therefore there is little or no reduction of the compression, saturated output power or IP3. Internally, resistively, sensed Darlington amplifier 100 improves the output characteristics, allows for class A/B operation, and reduces or eliminates the need for isolation components, thus improving the low frequency noise performance when compared to conventional active biasing Darlington circuits discussed above.

In the example shown in FIG. 3, internally, resistively, sensed Darlington amplifier 100 includes active devices or input and output transistors that are shown as bipolar junction transistors (Ms). In other examples, the active devices may be field effect transistors or similar type active devices.

Figure 4:
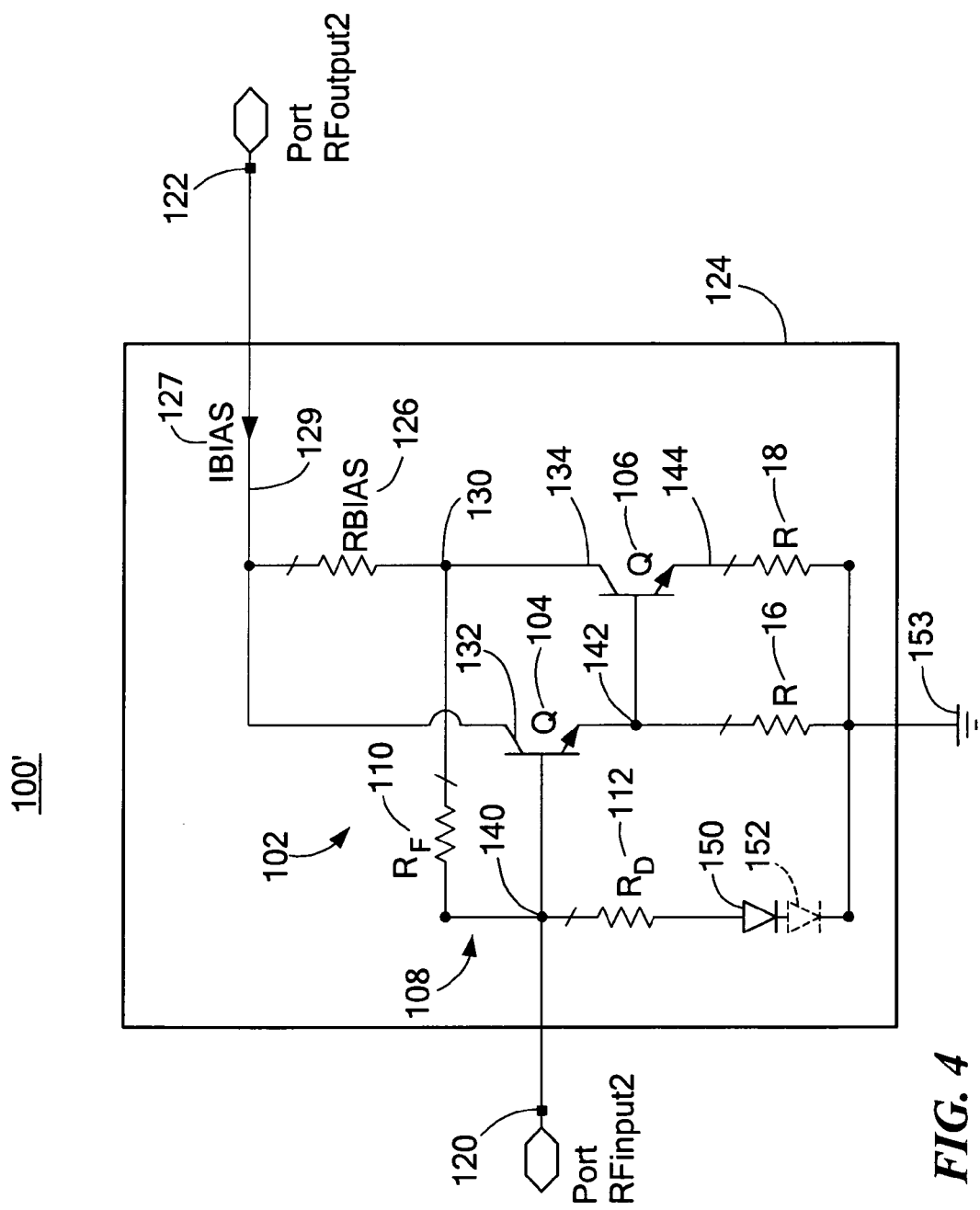
FIG. 4 is a schematic circuit diagram of another embodiment of the internally, resistively, sensed Darlington amplifier of this invention.

Internally, resistively, sensed Darlington amplifier 100', FIG. 4, where like parts have been like numbers, may include one or more diodes, e.g., diode 150, coupled between divider resistor $R_D$-112, and ground 153. In this example, diode 150 is preferably configured to adjust the DC voltage at signal input node 120 to improve compensation for temperature and process variations of input transistor Q-104 and output transistor Q-106. This is accomplished because diode 150 has a base to emitter voltage drop that can be matched to that of input transistor Q-104 and output transistor Q-106, particularly if they are manufactures together as part of an integrated circuit and thermally coupled to each other. Thus, the voltage at node 140 would be raised or lowered correspondingly in accordance with the process and temperature variations. Although in this example, only one diode 150 is shown, in other examples there may be two diodes, e.g., as shown by diode 152 in phantom, or any number of diodes as needed.

Figure 5:
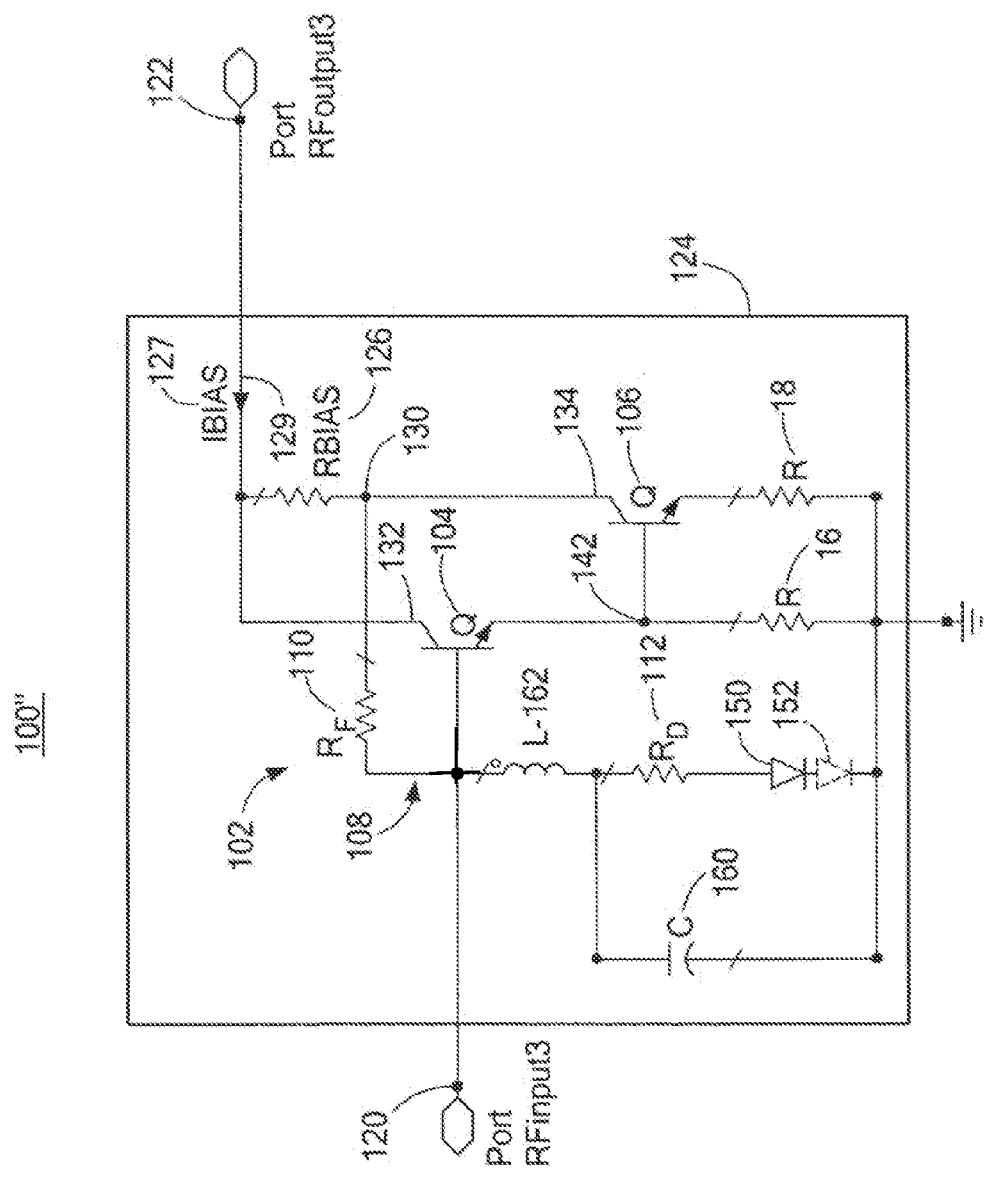
FIG. 5 is a schematic circuit diagram of another embodiment of the internally, resistively, sensed Darlington amplifier of this invention.

In one design, internally resistively sensed Darlington amplifier 100'', FIG. 5, where like parts have been given like numbers, may include inductor L-162 coupled in series between feedback resistor $R_F$-110 and divider resistor $R_D$-112 as shown. Inductor L-162 preferably provides isolation of divider resistor $R_D$-112 and diode(s) 150 and/or 152 from signal input node 120. Additional isolation can be provided by capacitor C-160 which bypasses to ground any RF input signal leaking through inductor 162, or any RF noise generated by resistor $R_D$-112 and diodes 150, 152. These isolation elements help improve the noise performance and input/output port impedance matching of the internally, resistively, sensed Darlington amplifier 100'' with respect to the FIG. 4 embodiment.

Figure 6:
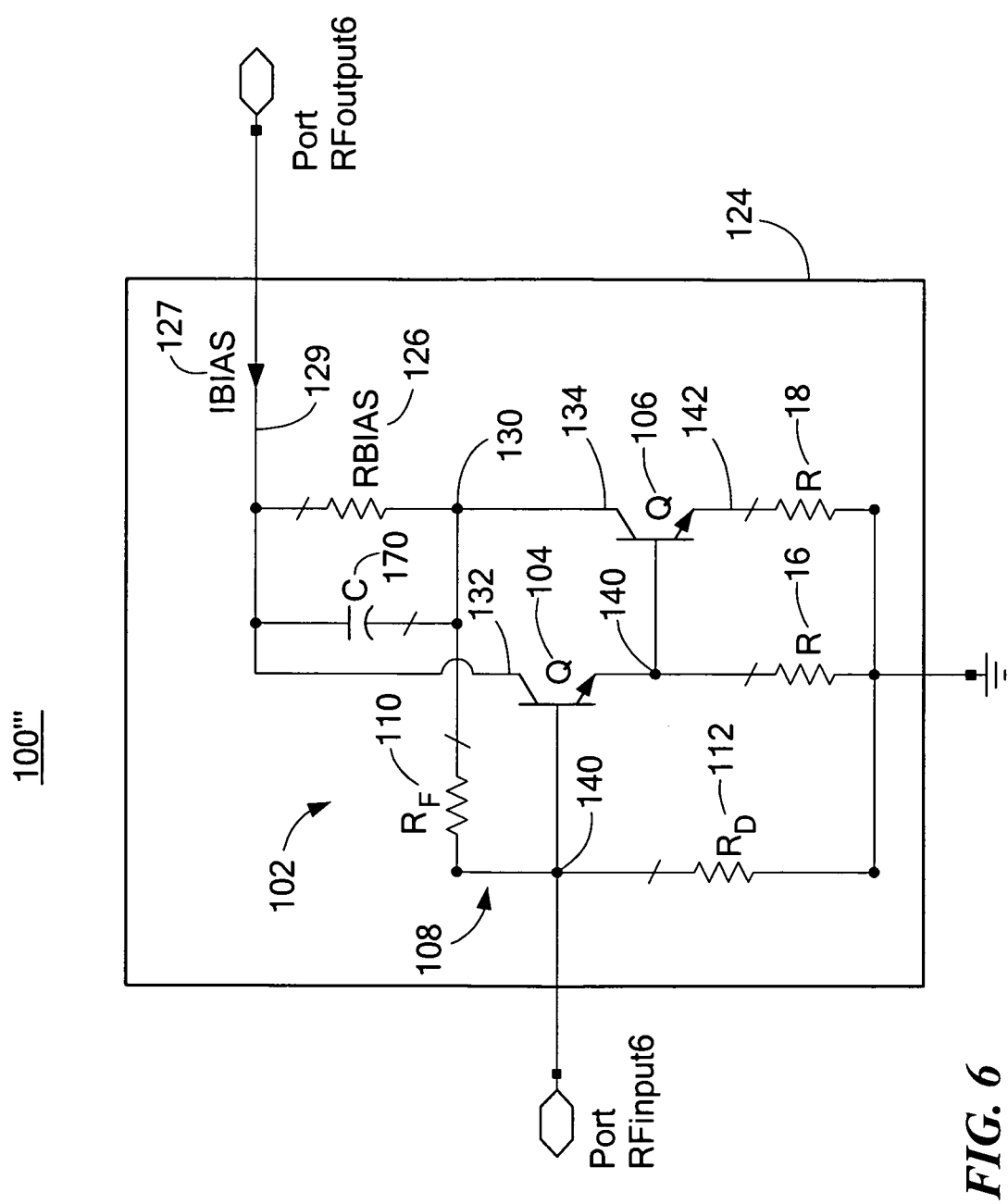
FIG. 6 is a schematic circuit diagram of yet another embodiment of the internally, resistively, sensed Darlington amplifier of this invention.

Internally, resistively, sensed Darlington amplifier 100''', FIG. 6, where like parts have been given like numbers, is similar to internally, resistively, sensed Darlington amplifier 100, FIG. 3, except in this example, internally, resistively, sensed Darlington amplifier 100''' includes capacitor C-170 connected in parallel with internal bias setting resistor $R_{BIAS}$-126, as shown. Capacitor C-170 is configured to short $R_{BIAS}$-126 at high frequencies. This configuration can help match the input and output RF impedance characteristics of the Darlington amplifier. Similar benefit may be obtained by adding capacitor C-170 to internally, resistively, sensed Darlington amplifier 100', FIG. 4 and internally, resistively, sensed Darlington amplifier 100'', FIG. 5.

It should be noted that internally, resistively, sensed Darlington amplifiers 100', 100'', 100''', FIGS. 3-5, all need a bias inductor, e.g., similar to inductor 36, FIG. 1, to couple the DC supply voltage and current to the amplifier. However, internally, resistively, sensed Darlington amplifier 100, FIGS. 3-6, does not require external bias resistor 32, FIG. 1, so that the full Vcc supply voltage can be applied to the amplifier output node. As a result, there is no reduction in voltage headroom for the input transistor Q-104 and therefore there is little or no reduction of the compression, saturated output power or IP3 of the amplifier.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. An internally, resistively, sensed Darlington amplifier comprising:
   a Darlington amplifier including at least an input transistor, an output transistor, a resistive divider, a signal input node, and a signal output node, the Darlington amplifier responsive to an input signal and configured to generate an output signal; and
   an internal bias setting resistor having a first end and a second end, the first end being coupled to the signal output node and a collector of the input transistor, the second end being coupled to a collector of the output transistor and the resistive divider, the internal bias setting resistor configured to set and regulate a bias current of the Darlington amplifier.

2. The internally, resistively, sensed Darlington amplifier of claim 1 in which the Darlington amplifier is implemented on an integrated circuit chip and/or within a common package.

3. The internally, resistively, sensed Darlington amplifier of claim 1 in which the Darlington amplifier and the internal bias setting resistor are included on an integrated circuit chip and/or housed in a common package.

4. The internally, resistively, sensed Darlington amplifier of claim 1 in which the resistive divider includes a feedback resistor and a divider resistor.

5. The internally, resistively, sensed Darlington amplifier of claim 4 further including one or more diodes coupled in series between the divider resistor and a ground, the one or more diodes configured to adjust DC voltage at the signal input node to compensate for temperature and process variations in the input transistor and the output transistor.

6. The internally, resistively, sensed Darlington amplifier of claim 5 further including at least one inductor coupled in series between the feedback resistor and the divider resistor, the at least one inductor configured to provide isolation of the divider resistor and/or the one or more diodes from the signal input node.

7. The internally, resistively, sensed Darlington amplifier of claim 6 further including at least one capacitor coupled between the at least one inductor and a ground terminal, the at least one capacitor configured to provide RF bypassing around the divider resistor.

8. The internally, resistively, sensed Darlington amplifier of claim 1 further including a capacitor connected in parallel with the internal bias setting resistor, the capacitor configured to short the internal bias setting resistor at high frequencies.

9. An internally, resistively, sensed Darlington amplifier comprising:
   a Darlington amplifier including at least an input transistor, an output transistor, a resistive divider comprising a feedback resistor and a divider resistor, a signal input node, and a signal output node, the Darlington amplifier responsive to an input signal and configured to generate an output signal;
   an internal bias setting resistor coupled between the signal output node and a collector of the output transistor, the internal bias setting resistor further coupled between the signal output node and the resistive divider, the internal bias setting resistor configured to set and regulate a bias current of the Darlington amplifier; and
   one or more diodes coupled in series between the divider resistor and a ground, the one or more diodes configured to adjust DC voltage at the signal input node to compensate for temperate and process variations in the input transistor and the output transistor.

10. The internally, resistively, sensed Darlington amplifier of claim 9 in which the Darlington amplifier is implemented on an integrated circuit chip and/or within a common package.

11. The internally, resistively, sensed Darlington amplifier of claim 9 in which the Darlington amplifier and the internal bias setting resistor are included on an integrated circuit chip and/or housed in a common package.

12. The internally, resistively, sensed Darlington amplifier of claim 9 further including at least one capacitor coupled in parallel with the diode and the divider resistor, the at least one capacitor configured to provide isolation of the divider resistor and/or the one or more diodes from the signal input node.

13. The internally, resistively, sensed Darlington amplifier of claim 12 further including at least one inductor coupled in series between the feedback resistor and the divider resistor, the at least one inductor configured to provide isolation of the divider resistor and/or the one or more diodes from the signal input node.

14. The internally, resistively, sensed Darlington amplifier of claim 13 further including at least one capacitor coupled between the at least one inductor and a ground terminal, the at least one capacitor configured to provide RF bypassing around the divider resistor.

15. The internally, resistively, sensed Darlington amplifier of claim 9 further including a capacitor connected in parallel with the internal bias setting resistor, the capacitor configured to short the internal bias setting resistor at high frequencies.

16. An internally, resistively, sensed Darlington amplifier comprising:
   a Darlington amplifier including at least an input transistor, an output transistor, a resistive divider, a signal input node, and a signal output node, the Darlington amplifier responsive to an input signal and configured to generate an output signal;
   an internal bias setting resistor coupled between the signal output node and a collector of the output transistor, the internal bias setting resistor further coupled between the signal output node and the resistive divider, the internal bias setting resistor configured to set and regulate a bias current of the Darlington amplifier; and
   a capacitor connected in parallel with the internal bias setting resistor, the capacitor configured to short the internal bias setting resistor at high frequencies.

17. The internally, resistively, sensed Darlington amplifier of claim 16 in which the Darlington amplifier is implemented on an integrated circuit chip or a transistor package.

18. The internally, resistively, sensed Darlington amplifier of claim 17 in which the internal bias setting transistor is implemented on the integrated circuit chip or the transistor package.

19. The internally, resistively, sensed Darlington amplifier of claim 16 in which the resistive divider includes a feedback resistor and a divider resistor.

20. The internally, resistively, sensed Darlington amplifier of claim 19 further including one or more diodes coupled in series between the divider resistor and a ground, the one or more diodes configured to adjust DC voltage at the signal input node to compensate for temperature and process variations in the input transistor and the output transistor.

21. The internally, resistively, sensed Darlington amplifier of claim 20 further including at least one capacitor coupled between the at least one inductor and a ground terminal, the at least one capacitor configured to provide RF bypassing around the divider resistor.

* * * * *